(12) United States Patent
Liou

(10) Patent No.: US 7,133,790 B2
(45) Date of Patent: Nov. 7, 2006

(54) METHOD AND SYSTEM OF CALIBRATING THE CONTROL DELAY TIME

(75) Inventor: Ming-Shi Liou, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 11 days.

(21) Appl. No.: 10/907,402

(22) Filed: Mar. 31, 2005

(65) Prior Publication Data

US 2005/0156646 A1    Jul. 21, 2005

Related U.S. Application Data

(63) Continuation of application No. 10/249,561, filed on Apr. 18, 2003, now Pat. No. 6,915,226.

(30) Foreign Application Priority Data

Jun. 21, 2002    (TW) .............................. 91113583 A

(51) Int. Cl.
   *G01D 18/00*    (2006.01)
(52) U.S. Cl. ........................................ 702/89; 711/167

(58) Field of Classification Search ................... 702/89
   See application file for complete search history.

(56) References Cited

U.S. PATENT DOCUMENTS 6,587,804 B1 *   7/2003   Johnson et al. ............. 702/107

* cited by examiner

*Primary Examiner*—Michael Nghiem
*Assistant Examiner*—Stephen J. Cherry
(74) *Attorney, Agent, or Firm*—Jianq Chyun IP Office

(57) ABSTRACT

The present invention relates to a method and system of calibrating the control delay time, providing effective calibration for the control delay time provided by a control chip to reach the optimal effect for effective reading. The control chip uses the connected buffer chip to produce a training sequence when the buffer chip enters a training mode. After the control chip receives the training sequence, the control chip will produce the training data to compare with the predefined pattern inside it and adjust the control delay time. Finally, the control chip will produce an optimal adjusting control delay time to allow the data strobe signal to control the effective retrieved range of the data.

16 Claims, 3 Drawing Sheets

METHOD AND SYSTEM OF CALIBRATING THE CONTROL DELAY TIME

CROSS-REFERENCE TO RELATED APPLICATION

This application is a continuation of a prior application Ser. No. 10/249,561, filed Apr. 18, 2003 now U.S. Pat. No. 6,915,226, which claims the priority benefit of Taiwan application serial no. 91113583, filed on Jun. 21, 2002.

BACKGROUND OF THE INVENTION

1. Field of Invention

The present invention generally relates to a method and system of calibrating the control delay time, and more particularly, to a calibration method and system used to define the effective retrieved range of the control delay time to obtain the optimal control delay time when the control chip is performing the reading operation.

2. Description of Related Art

Since the development of the data processing speed for the currently used personal computer is getting faster and faster, the requirement of the efficiency and accuracy for accessing the data stored in memory needs to be relatively improved, so as to effectively adapt with the data processing speed of the personal computer CPU. Therefore, how to assure the accuracy of the data read from memory when the control chip performs the memory read operation becomes a very important subject.

The method for the control chip (e.g. north bridge chip) to access memory uses the data strobe signal (acronym as DQS hereinafter) after an appropriate delay to latch the memory data signal. For the Double Data Rate Synchronous Dynamic Random Access Memory (acronym as DDR SDRAM), a quarter cycle control delay time is provided. Generally speaking, the control delay time in the control chip is determined by a set control delay value, and the control delay time can be changed by modifying the magnitude of the control delay value. Moreover, the control chip used currently is set by the BIOS based on the default values when the system is initialized only one time, and the default values are set based on the data sheet provided by the control chip vendor. Since the default values cannot be adjusted according to factors such as the individual environment, element status or the circuit layout, the control delay time is not located at the optimal position, so factors that make the system unstable increase.

The more advanced control chips used currently can estimate the initial control delay value from the loop, and the value can compensate for the impact due to manufacture factor of the whole system. However, under the circumstance where the clock cycle gets higher, the accuracy and the reliability of the control delay time obtained by using such a method gets lower and lower.

SUMMARY OF THE INVENTION

Therefore, the present invention provides a method and system of calibrating control delay time, and further effectively adjusts the control delay time to achieve optimization. Therefore, the accuracy of the data read from memory when the control chip performs the memory read operation can be assured and the efficiency of the memory read can be achieved.

In order to achieve the objectives mentioned above and others, the present invention provides a method of calibrating the control delay time. The method effectively calibrates the control delay time sent from the control chip, and a buffer chip is provided to connect the control chip and the memory. When it is under operation, the buffer chip enters into a training mode at first to produce a training sequence for the control chip as a training data. Then, the training data is compared with a predefined pattern inside the control chip to produce a comparison result signal. Finally, the control delay time is adjusted according to the comparison result signal. A memory read command and a memory write command sent from the control chip are used to control the buffer chip entering into the training mode mentioned above, and the control method is achieved by simultaneously enabling the memory read command and the memory write command.

In addition, in order to obtain an optimal adjusting effect of the control delay time, after the training data is compared with the predefined pattern, an effective retrieved range of the control delay time is further measured. The operation method comprises the steps as follows: at first, the training data is compared with the predefined pattern under the control delay time to determine whether the data strobe signal that is delayed according to the control delay time is located in the effective retrieved range or not. If it cannot be effectively retrieved, the control delay time is adjusted until it is located in the effective retrieved range. Contrarily, if it can be effectively retrieved, a maximum control delay time and a minimum control delay time of the effective retrieved range are further explored. The maximum control delay time and the minimum control delay time mentioned above are the two margin values of the effective retrieved range. When exploring the maximum control delay time and the minimum control delay time, the control delay time for the effective retrieved range and for the ineffective retrieved range are used to approach and obtain the maximum control delay time and the minimum control delay time by using a dimidiation method (e.g. retrieving the median value) or an approaching method. Accordingly, a mathematic combination (such as a median value) of the maximum control delay time and the minimum control delay time of the effective retrieved range is used to adjust the control delay time.

In addition, the present invention also provides a system of calibrating control delay time. The system comprises a control chip and a buffer chip. The control chip produces a control delay time, and the buffer chip connects to the control chip. When the buffer chip enters into a training mode, a training sequence is produced for the control chip as a training data. After the training data is compared with a predefined pattern inside it, the control delay time is adjusted. The control chip is such as the north bridge chip, and the buffer chip also can be integrated into a memory as designed. The control chip comprises a latch circuit, a delay circuit, a comparison circuit, and a delay adjusting circuit. Wherein, the latch circuit receives a training sequence of the buffer chip. The delay circuit controls a training data output from the latch circuit. The comparison circuit compares the training data with a predefined pattern to determine whether the data strobe signal generated according to the control delay time is located in an effective retrieved range or not, and sends out a comparison result signal to the delay adjusting circuit as a reference to adjust the control delay time.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings, FIG. 1 schematically shows a block diagram of a system of calibrating the control delay time of a preferred embodiment according to the present invention.

DESCRIPTION OF THE PREFERRED EMBODIMENTS

Figure 1:
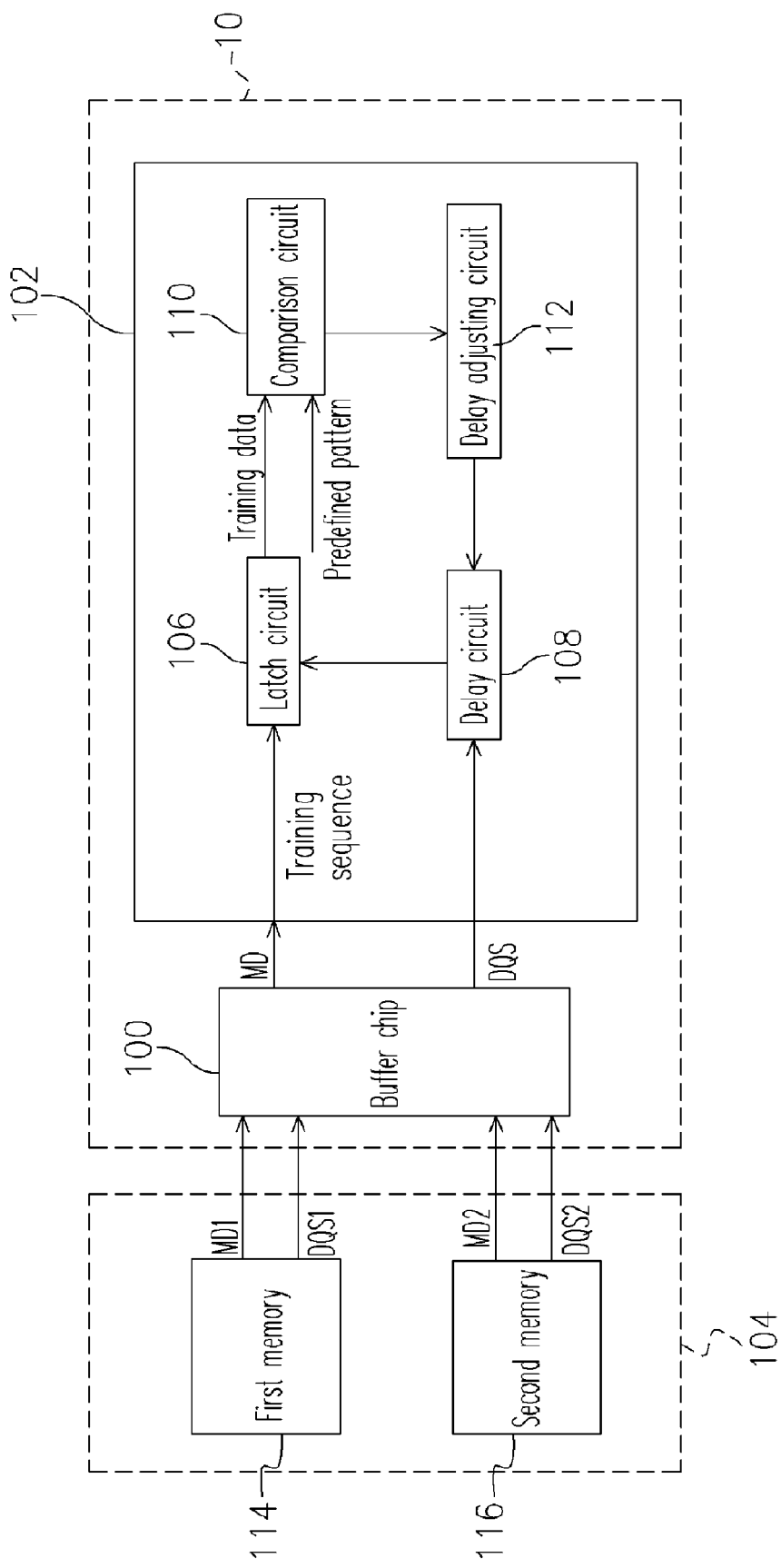

FIG. 1 schematically shows a block diagram of a system of calibrating the control delay time of a preferred embodiment according to the present invention. As shown in the diagram, the system of calibrating the control delay time 10 comprises a buffer chip 100 and a control chip 102 (e.g. a north bridge chip). Wherein, the buffer chip 100 connects to the control chip 102 and a memory 104. The buffer chip 100 mentioned above may be integrated into the memory 104 or separated from the memory 104 as designed. The control chip 102 comprises a latch circuit 106, a delay circuit 108, a comparison circuit 110 and a delay adjusting circuit 112.

Herein, in order to adapt to the control chip 102 for rapidly reading the data from memory, so as to improve the processing speed and the performance of the computer system. The memory 104 comprises a first memory 114 and a second memory 116. The DDR SDRAM is used as the first memory 114 and the second memory 116 to access data. That is, two memory data can be accessed within a memory clock cycle. After the general control chip 102 issues a memory read command, the first memory 114 and the second memory 116 respectively sends out two memory data to the buffer chip 100 within a memory clock cycle under the DDR operation mode, and the control chip 102 receives four memory data from the buffer chip 100. Similarly, after the general control chip 102 issues a memory write command, the first memory 114 and the second memory 116 receive memory data from the buffer chip 100, under the DDR mode, the control chip 102 sends out four memory data to the buffer chip 100 and respectively dispatches two memory data to the first memory 114 and the second memory 116 within one memory clock cycle. Generally speaking, two times memory clock speed is operated in between the buffer chip 100 and the control chip 102, and two memory data can be received/sent within one cycle of this two times memory clock cycle.

When performing the reading operation, the buffer chip 100 receives a data strobe signal DQS1 and a memory data signal MD1 sent from the first memory 114 and a data strobe signal DQS2 and a memory data signal MD2 sent from the second memory 116. Therefore, the buffer chip 100 can appropriately latch the memory data on the memory data signal (MD1, MD2) according to the data strobe signal (DQS1, DQS2). The frequency of the data strobe signal DQS1, DQS2 sent from the first memory 114 and the second memory 116 is the frequency of the memory clock.

After the memory data is acquired, the buffer chip 100 generates a data strobe signal DQS (the frequency of the data strobe signal is two times frequency of the memory clock) and the memory data signal MD for the control chip 102.

The delay circuit 108 inside the control chip 102 delays the received DQS signal a certain period of time according to a control delay time, and sends the delayed DQS signal to the latch circuit 106 in which the memory data signal (MD) is physically latched and the consequence process can be performed. The data strobe signal DQS comprises DQS[8:0], and the memory data signal has 72 signal lines. The 64 bits transferred data can be represented as MD[63:0], and the 8 bits parity data can be represented as MD[71:64]. Each DQS corresponds to a byte of MD, for example, DQS0 corresponds to MD[7:0].

Figure 2:
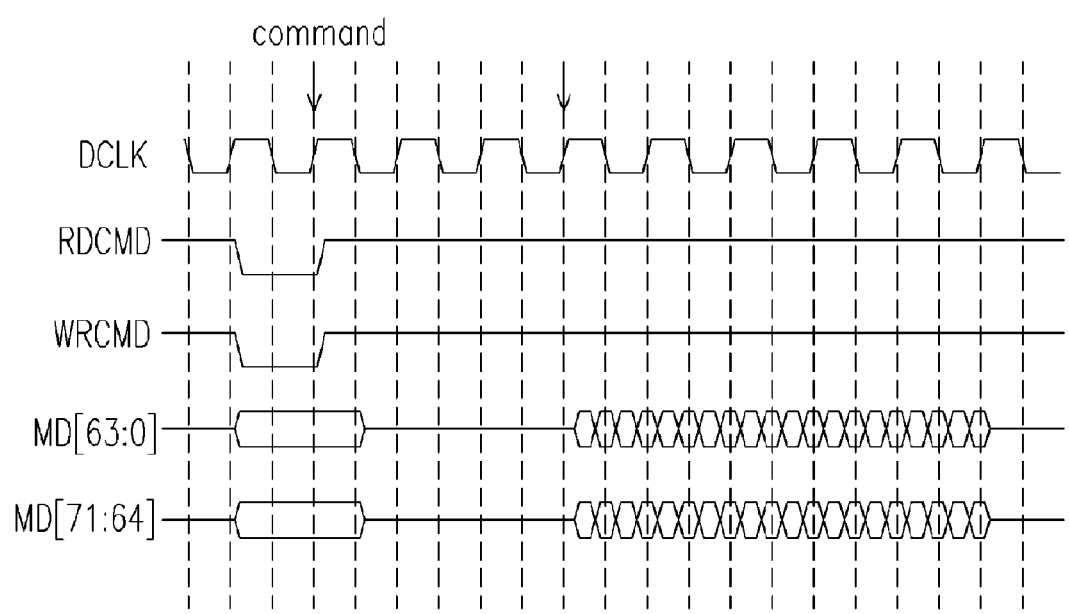
FIG. 2 schematically shows the external signal variation of the control chip and the buffer chip when they are operated in the training mode.

Since the memory read operation is performed on the rising edge and the falling edge of the DQS when the delayed DQS mentioned above is used to latch the MD, the control chip 102 has to delay DQS a certain time, so that the delayed DQS can fall in the effective retrieved range of the memory data correctly to assure the memory data on the MD can be read accurately. Either too much or too little DQS control delay time makes the memory data read by the control chip 102 inaccurate. The system of calibrating the control delay time of the present invention focuses on the control delay time generated by the control chip 102, and performs the calibration with the help of the buffer chip 100. The buffer chip 100 provided in between the control chip 102 and the memory 104 couples to both the control chip 102 and the memory 104. When the buffer chip 100 enters into a training mode, the operation is shown as in FIG. 2. FIG. 2 schematically shows the signal variation of the control chip 102 and the buffer chip 100 when they are operated in the training mode. The control chip 102 issues a memory read command (RDCMD) and a memory write command (WRCMD) signal simultaneously to control the operation, and enters into the training mode only when both commands are enabled (from High to Low). At this time, the data provided by MD[71:0] is sent by the control chip 102 to control the buffer chip 100, so that the control chip 100 can enter into the training mode. That is, after the memory read command (RDCMD) and the memory write command (WRCMD) are operated simultaneously, the data on the MD signal line is the command for entering into the training mode. The data presented on MD[71:0] is the training sequence output from the buffer chip 100 to the control chip 102. In addition, if the buffer chip 100 is integrated into the memory chip 104, the method of entering/exiting training mode also can be provided by extending the mode register set command of the currently used DDR SDRAM.

After the buffer chip 100 enters into a training mode, the buffer chip 100 sends out a predefined pattern that is stored in the buffer chip 100 by using the memory data line MD accompanied with the data strobe signal DQS. The signal in the memory data line MD is a training sequence that is to be transferred to the control chip 102, and to be latched as a training data. The training data is further compared with a predefined pattern inside the control chip to generate a calibration signal. The calibration signal is subsequently used to adjust the original control delay time to achieve the optimal status.

Figure 3:
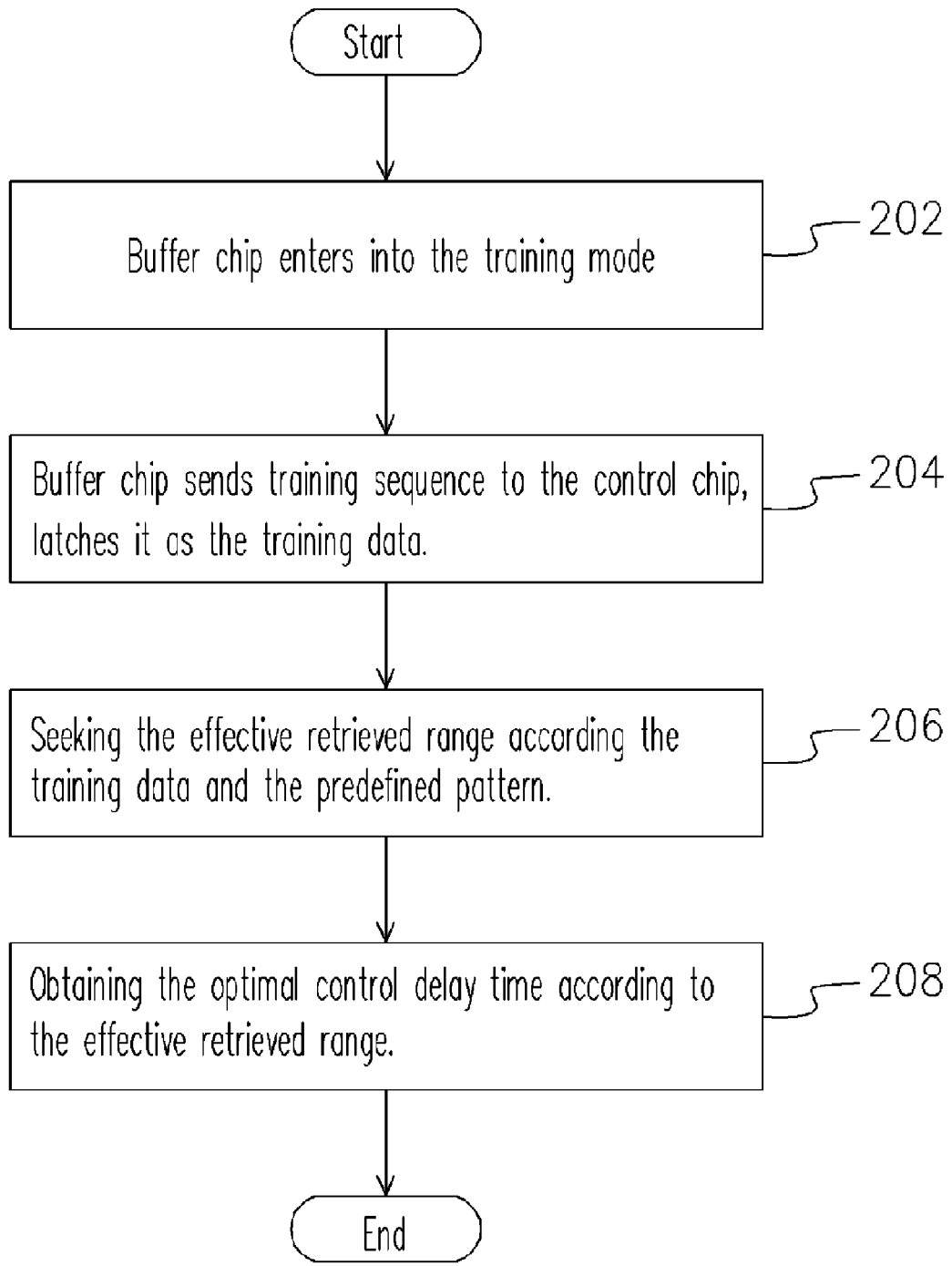
FIG. 3 schematically shows a flow chart of the method of calibrating the control delay time according to the present invention.

The physical operating procedures are described in detail hereinafter with referring to FIG. 3. FIG. 3 is a flow chart of a method of calibrating the control delay time according to the present invention. Please also refer to the system structure of calibrating the control delay time as shown in FIG. 1. At first, when the control chip 102 intends to perform the calibration for the control delay time, the control chip 102 has the buffer chip 100 enter into a training mode with an appropriate mechanism (step 202), the mechanism is, for example, using the memory read command (RDCMD) and the memory write command (WRCMD) to control the operation as mentioned above. At this time, the buffer chip 100 outputs a training sequence on the memory data signal MD, and provides a data strobe signal DQS for latching the training sequence. In the receiving side, the delay circuit 108 inside the control chip 102 delays the data strobe signal DQS according to the control delay time, and has the latch circuit 106 inside the control chip 102 retrieve the training sequence on the memory data signal MD as a training data (step 204). Whether the delayed data strobe signal DQS falls in an effective retrieved range of the memory data signal MD or not is determined by comparing the training data output from the latch circuit 106 and received by the comparison circuit 110 inside the control chip 102 with a predefined pattern inside the control chip 102. Afterwards, the comparison circuit 110 sends the comparison result to the delay circuit 108 inside the control chip 102 to modify the control delay time. Therefore, by repeatedly performing these steps, the margin of the effective retrieved range of the memory data on the memory data signal can be confirmed (step 206).

After the margin of the effective retrieved range is acquired, the minimum control delay time and the maximum control delay time can be obtained from those two margin values of the effective retrieved range. That is, the accurate training sequence can be obtained by using either the minimum control delay time or the maximum control delay time to latch the memory data signal. So that an optimal control delay time can be chosen within a range from the minimum control delay time to the maximum control delay time (step 208). The optimum control delay time is controlled to be any of the mathematic combination signals of the minimum control delay time and the maximum control delay time of the effective retrieved range. The median value of the minimum control delay time and the maximum control delay time is generally used in the design.

The dimidiation method (e.g. retrieving a median value) applied on two control delay times of the effective retrieved range and the ineffective retrieved range is used to gradually approach the two margin values when seeking the margin of the effective retrieved range of the memory data in step 206 mentioned above. That is, the control delay time is modified by the delay adjusting circuit 112 according to the comparison result of the comparison circuit. The dimidiation method mentioned above is repeatedly used to receive the training sequence sent from the buffer chip 100 and to compare it with a predefined pattern inside the control chip 102 in the comparison circuit 110, so as to confirm the margin of the effective retrieved range of the memory data on the memory data signal. In addition, the maximum control delay time and the minimum control delay time of the margin values of the present invention also can be obtained by using other methods. For example, when the control delay time is not the margin value and needs to be adjusted, if the control delay time gradually increases and reaches a certain value, so that having the corresponding training data that is originally inaccurate become accurate, the control delay time at this moment is the minimum control delay time. When the control delay time keeps increasing and reaches another certain value, so that having the corresponding training data that is originally accurate become inaccurate, the control delay time at this moment is the maximum control delay time. The other example is, when the control delay time is not the margin value and needs to be adjusted, if the control delay time gradually decreases and reaches a certain value, so that having the corresponding training data that is originally inaccurate become accurate, the control delay time at this moment is the maximum control delay time. When the control delay time keeps decreasing and reaches another certain value, so that having the corresponding training data that is originally accurate become inaccurate, the control delay time at this moment is the maximum control delay time.

The method and system of calibrating the control delay time according to the present invention assures the accuracy of the data transfer between the buffer chip and the control chip, and further has the control chip rapidly and effectively adjust the control delay time, so that accurate memory data can be obtained when the control chip performs the memory read operation, and further to achieve the effective retrieval.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A method of calibrating a control delay time, comprising:
    enabling a memory read command and a memory write command to enter into a training mode;
    generating a training sequence after entering the training mode;
    generating a training data from the training sequence according to a control delay time;
    comparing the training data with a predefined pattern to produce a comparison result signal; and
    adjusting the control delay time according to the comparison result signal.

2. The method of calibrating the control delay time of claim 1, wherein the comparison result signal is obtained by comparing the training data with the predefined pattern, and is used to indicate whether a data strobe signal delayed by the control delay time falls in an effective retrieved range or not.

3. The method of calibrating the control delay time of claim 2, wherein the effective retrieved range comprises a maximum control delay time and a minimum control delay time, and the maximum control delay time and the minimum control delay time are the two margin values of the effective retrieved range.

4. The method of calibrating the control delay time of claim 3, wherein the comparison result signal is produced based on the maximum control delay time and the minimum control delay time, and is used to adjust the control delay time to produce an optimal control delay time.

5. The method of calibrating the control delay time of claim 4, wherein the optimal control delay time is produced by choosing a medium value or the maximum control delay time and the minimum control delay time.

6. The method of calibrating the control delay time of claim 3, wherein a measure of the effective retrieved range comprises the steps of:
    determining whether the control delay time falls in the effective retrieved range or not;
    repeatedly adjusting the control delay time until the control delay time falls in the effective retrieved range if the control delay time is ineffectively retrieved; and
    further seeking the maximum control delay time and the minimum control delay time of the effective retrieved range if the control delay time is effectively retrieved.

7. The method of calibrating the control delay time of claim 6, wherein the maximum control delay time and the minimum control delay time are obtained by using a dimidiation method.

8. The method of calibrating the control delay time of claim 6, wherein the maximum control delay time and the minimum control delay time are obtained by gradually increasing or gradually decreasing to approach the effective retrieved range and the ineffective retrieved range.

9. A method of calibrating a control delay time, comprising:
   enabling a memory read command and a memory write command for entering into a training mode;
   generating attaining sequence after entering the training mode;
   generating a training data from the training sequence according to a control delay time;
   comparing the training data with a predefined pattern to produce a comparison result signal;
   optimally adjusting the control delay time according to the comparison result signal; and
   adjusting delay amount of a data strobe signal in response to the optimal control delay time, for latching a memory data signal.

10. The method of calibrating the control delay time of claim 9, wherein the comparison result signal is obtained by comparing the training data with the predefined pattern, and is used to indicate whether the data strobe signal delayed by the control delay time falls in an effective retrieved range or not.

11. The method of calibrating the control delay time of claim 10, wherein the effective retrieved range comprises a maximum control delay time and a minimum control delay time, and the maximum control delay time and the minimum control delay time are the two margin values of the effective retrieved range.

12. The method of calibrating the control delay time of claim 11, wherein the comparison result signal is produced based on the maximum control delay time and the minimum control delay time, and is used to adjust the control delay time to produce the optimal control delay time.

13. The method of calibrating the control delay time of claim 12, wherein the optimal control delay time is produced by choosing a medium value of the maximum control delay time and the minimum control delay time.

14. The method of calibrating the control delay time of claim 11, wherein a measure of the effective retrieved range comprises:
   determining whether the control delay time falls in the effective retrieved range or not;
   repeatedly adjusting the control delay time until the control delay time falls in the effective retrieved range if the control delay time is ineffectively retrieved; and
   further seeking the maximum control delay time and the minimum control delay time of the effective retrieved range if the control delay time is effectively retrieved.

15. The method of calibrating the control delay time of claim 14, wherein the maximum control delay time and the minimum control delay time are obtained by using a dimidiation method.

16. The method of calibrating the control delay time of claim 14, wherein the maximum control delay time and the minimum control delay time are obtained by gradually increasing or gradually decreasing to approach the effective retrieved range and the ineffective retrieved range.

* * * * *